(12) United States Patent
Ess (10) Patent No.: US 6,727,765 B1
(45) Date of Patent: Apr. 27, 2004

(54) STOCHASTIC PULSE GENERATOR DEVICE AND METHOD OF SAME

(75) Inventor: David Van Ess, Arlington, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/186,466

(22) Filed: Jun. 28, 2002

(51) Int. Cl.$^7$ .............. H03B 29/00; H03K 3/84
(52) U.S. Cl. ................. 331/78; 327/164
(58) Field of Search .............. 331/78; 327/164, 327/176; 380/46, 47; 708/250, 251, 252

(56) References Cited

U.S. PATENT DOCUMENTS

| | | | | |
|---|---|---|---|---|
| 3,582,882 A | * | 6/1971 | Titcomb et al. | 340/146.2 |
| 3,633,015 A | * | 1/1972 | Lee | 708/252 |
| 3,746,847 A | * | 7/1973 | Maritsas | 708/250 |
| 4,571,546 A | * | 2/1986 | Wilkinson | 327/164 |
| 5,760,609 A | | 6/1998 | Sharpe-Geisler | 326/93 |
| 5,912,572 A | | 6/1999 | Graf, III | 327/144 |
| 5,912,573 A | | 6/1999 | Graf, III | 327/145 |
| 5,917,350 A | | 6/1999 | Graf, III | 327/144 |
| 5,929,676 A | | 7/1999 | Graf, III | 327/144 |

* cited by examiner

Primary Examiner—Robert Pascal
Assistant Examiner—Joseph Chang
(74) Attorney, Agent, or Firm—Wagner, Murabito & Hao LLP (57) ABSTRACT

A pulse generator. The pulse generator has a pseudo random number generator, a comparator coupled to the pseudo random number generator, and a register coupled comparator. The comparator performs comparisons of values generated by the pseudo random number generator and a value in the register, wherein the comparator outputs a pulse that is modulated according to the comparison. A low-pass filter may coupled to the comparator output and the register may receive samples of a digital signal. Low-pass filtering the comparator output implements a digital-to-analog converter that is less expensive than conventional delta-sigma modulator DACs and has better performance than conventional PWM DACs.

19 Claims, 9 Drawing Sheets

STOCHASTIC PULSE GENERATOR DEVICE AND METHOD OF SAME

FIELD OF THE INVENTION

The present invention relates to the field of pulse generators. Specifically, embodiments of the present invention relate to a device for generating a stochastically modulated pulse train and method of same.

BACKGROUND ART

Various methods have been proposed to implement a digital-to-analog converter (DAC). One such method is to create a pulse train whose average value is equal to the magnitude of the digital input and then average the pulse train by passing it through a low-pass filter. Conventionally, pulse wave modulators (PWM) are used to create the pulse train from a digital input signal. However, the quality of the analog signal that results from the filtered pulse train may contain considerable noise unless an expensive low-pass filter is constructed.

Figure 1A:
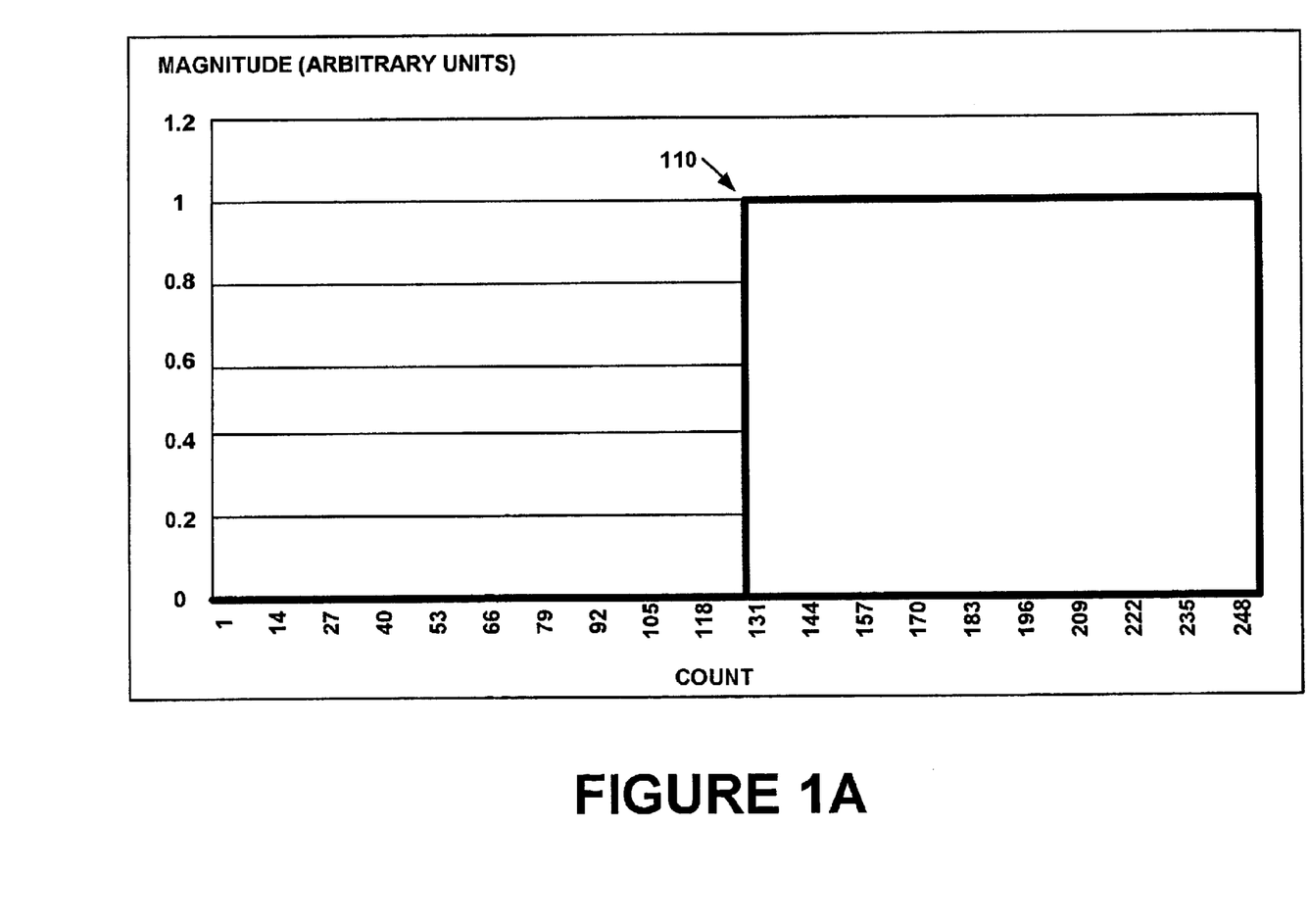
FIG. 1A illustrates a portion of a conventional pulse width modulated signal having its output high one-half of the time.

FIG. 1A illustrates a single pulse 110 that may be part of a pulse train of a conventional PWM. The exemplary conventional PWM is a 256 state PWM with the pulse width set to 128. In particular, the pulse is high one-half the time and low one-half the time, for an average value of one-half. As another example, a pulse width of 64 will be low for 192 clock cycles and high for 64, for an average value of 0.25. The circuitry for the PWM itself is relatively simple. Constructing the pulse train comprises flipping the output between low to high after a number of counts occur, as the horizontal axis shows.

Figure 1B:
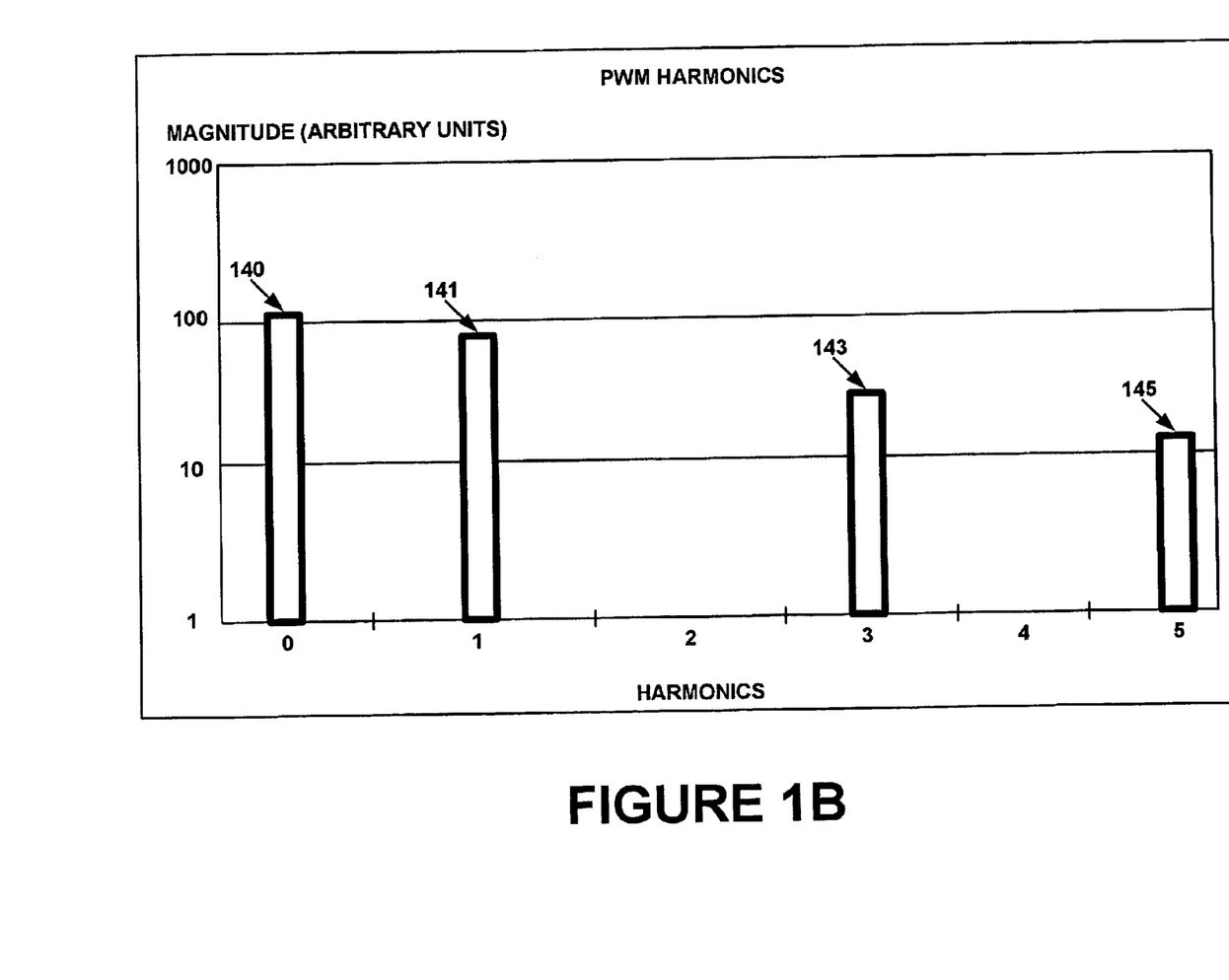
FIG. 1B illustrates harmonic content of the conventional pulse wave modulated signal of FIG. 1A.

However, due to the nature of the pulse train, the pulse 110 of the PWM has considerable energy at low harmonics, which are difficult to filter out. FIG. 1B illustrates harmonic content of the PWM pulse of FIG. 1A for lower harmonics. The desired signal (zeroeth harmonic 140) has a magnitude of 128 (arbitrary units). However, there is significant energy at the first, third, and fifth harmonics 141, 143, 145. In particular, the first harmonic 141 has a magnitude of nearly 100 and the third and fifth harmonics 143, 145 have a magnitude of considerably higher than ten. If the pulse 110 could be filtered in an ideal fashion to remove all harmonic content, then the analog output would accurately track the digital input. However, building such a low-pass filter to remove all harmonic content is not practical and building a low-pass filter to remove most of the harmonic content is expensive.

Figure 2:
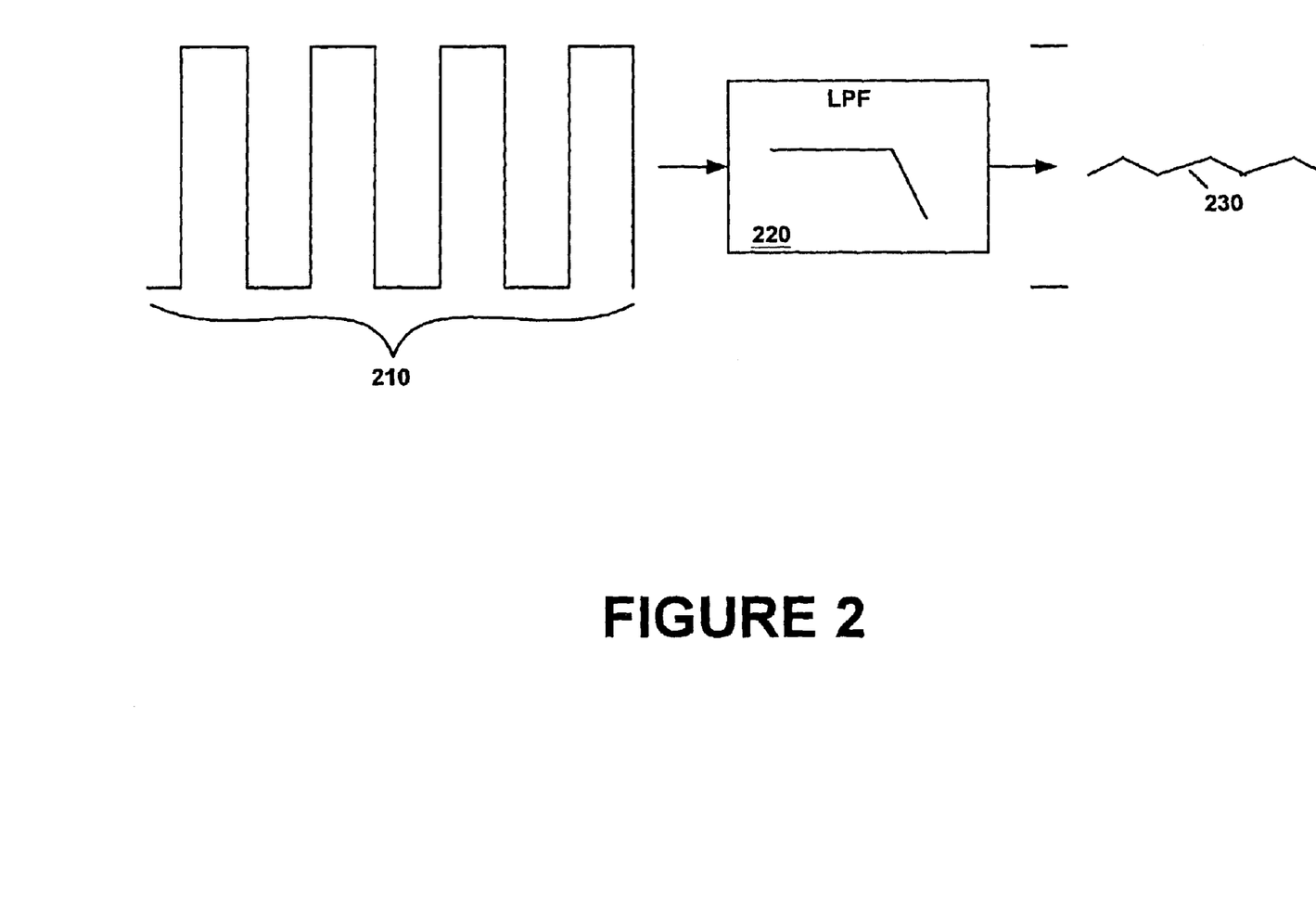
FIG. 2 illustrates results of filtering a conventional pulse width modulated signal.

Referring now to FIG. 2, if a conventional PWM generated pulse train 210 is processed with a low-pass filter 220 with a moderate roll-off, the analog output 230 will contain considerable noise due to the harmonics that are not completely filtered. Alternatively, a more expensive low-pass filter 220 (e.g., one with additional poles) may be constructed. However, this adds to the expense of the circuit and will still leave some harmonic energy. The extra poles will also slow the signal response. As the analog output 230 tends to track the average value of the PWM pulse train 210, the analog output 230 will have a delay when responding to changes in the average value of the PWM pulse train 210. This, of course, means that the analog output 230 will respond slowly to changes in value of the digital input signal. This will clearly be very detrimental it the analog output 230 is controlling a device, for example.

Thus, when implementing a DAC with a conventional PWM and low-pass filter 220, unless an expensive low-pass filler 220 is used, the analog output 230 will contain considerable harmonic energy (e.g., noise). Even a relatively expensive low-pass filter 220 will not totally remove the harmonic content. Furthermore, additional poles that are required to remove harmonic content may slow the signal response undesirably.

A second method of implementing a DAC is a delta-sigma modulator. A delta sigma modulator translates a binary value into a pulse train with a duty cycle that is proportional to the binary input. The pulse train is fed into a low-pass filter 220 to obtain the analog signal. Due to the nature of the delta-sigma modulator, its pulse train has better characteristics to filter then a PWM's pulse train 210. For example, its harmonic content is not as difficult to filter. Thus, the quality of its analog signal is better than the quality of the analog signal produced by most PWMs. However, a delta sigma modulator is expensive as it requires substantially more hardware than a PWM. For example, a first order delta-sigma modulator may require an adder at the input, an integrator, and a quantizer that produces the pulse train of zeroes and ones. To provide better results, delta-sigma modulators are commonly second order, requiring an additional stage having another adder and an accumulator or integrator.

Furthermore, there are applications such as dithering in which it is desirable to add a first signal into a second signal to improve the second signal or to increase its effective resolution. However, some conventional dithering techniques, such as adding a sine wave to the input of an analog-to-digital converter to increase its resolution, add frequency content at the frequency of the dithering signal.

SUMMARY OF THE INVENTION

Therefore, it would be advantageous to provide a DAC that is relatively inexpensive. It would also be advantageous to provide a DAC that has a high quality analog signal. It would also be advantageous to provide a DAC that produces a higher quality analog signal than a typical PWM DAC without the expense of a delta sigma modulator DAC. It would also be advantageous to provide a DAC whose response is not slowed by a low-pass filter with many poles, while providing a relatively simple circuit. It would be further advantageous to provide a device that may be used for applications such as dithering without inputting undesirable harmonic content.

Embodiments of the present invention provide a stochastically modulated pulse generator. In one embodiment, the pulse generator is used to implement a DAC. Embodiments of the present invention provide a DAC that produces a higher quality analog signal than a typical PWM DAC without the expense of a delta sigma modulator DAC. Embodiments of the present invention provide a device that may be used for dithering without injecting substantial undesired harmonic content. Embodiments of the present invention provide these advantages and others not specifically mentioned above but described in the sections to follow.

A pulse generator is disclosed. In one embodiment, the pulse generator may comprise a pseudo random number generator, a comparator coupled to the pseudo random number generator, and a register coupled to the comparator. The comparator may perform comparisons of values generated by the pseudo random number generator and a value in the register, wherein the comparator may output a pulse that is modulated according to the comparison.

In one embodiment, a low-pass filter may be coupled to the comparator output. Also, the register may receive samples of a digital signal. Implementing a DAC by filtering the comparator output may be less expensive than conventional delta-sigma modulator DACs and may have better performance than conventional PWM DACs.

Another embodiment provides for a method of generating a stochastically modulated pulse. The method may comprise loading a value into a register, and generating a series of pseudo random numbers. The register value may be compared to the pseudo random numbers. The results of the comparisons may be output. In this fashion, the register value may be modulated by the pseudo random numbers to produce a stochastically modulated pulse train.

In one embodiment, in addition to the steps of the previous paragraph, samples of a digital signal may be fed into the register and the output of the comparator may be low-pass filtered. In this fashion, the pulse generator may implement a stochastically modulated DAC.

DETAILED DESCRIPTION OF THE INVENTION

In the following detailed description of the present invention, a stochastic pulse generator device and method of same, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Figure 3:
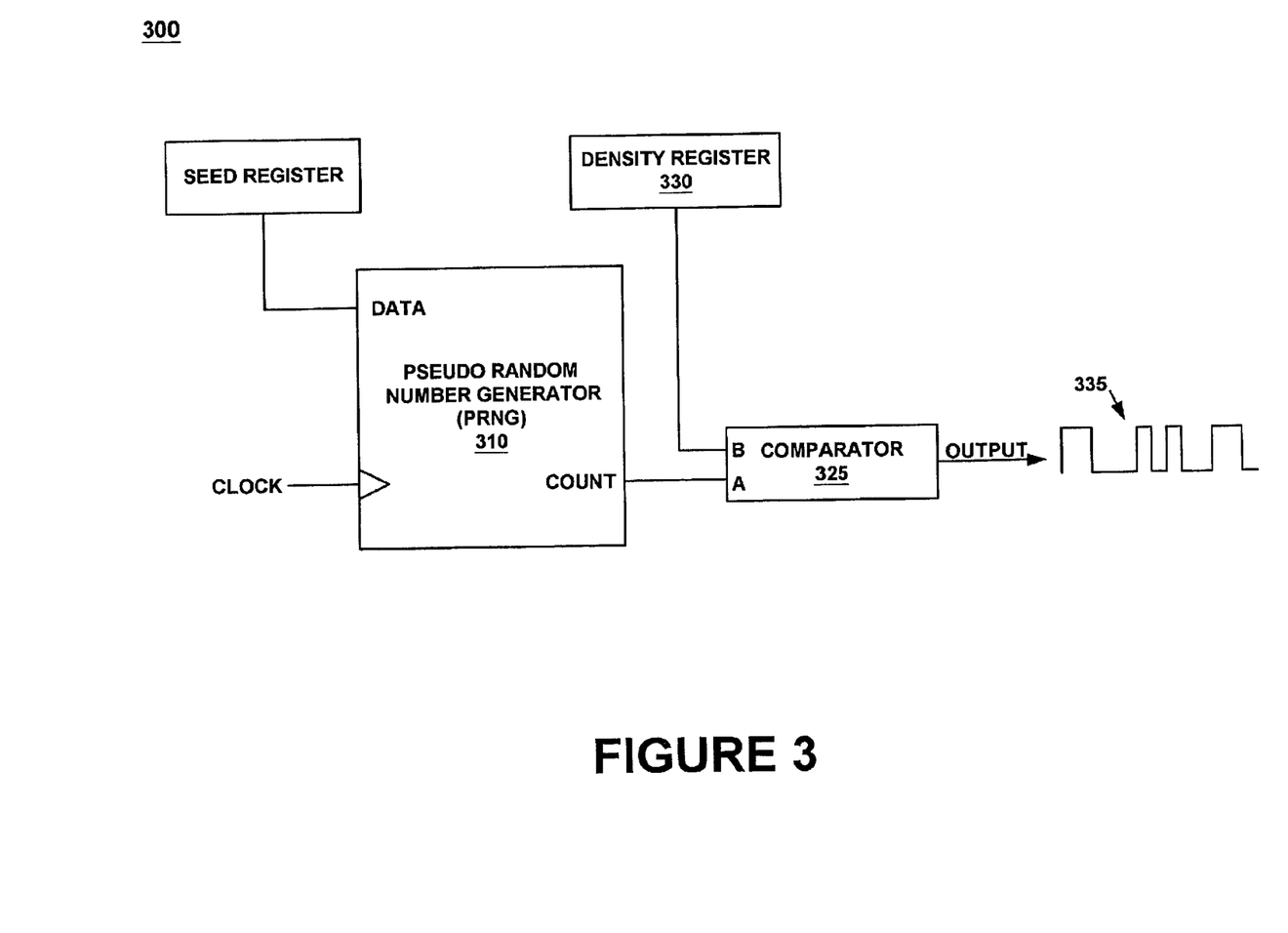
FIG. 3 illustrates a stochastic pulse generator, according to an embodiment of the present invention.

FIG. 3 illustrates a stochastic pulse generator 300, according to an embodiment of the present invention. The stochastic pulse generator 300 comprises a pseudo random number generator (PRNG) 310, for outputting a pseudo random number at the count output. A new pseudo random number may be generated each clock cycle. The pseudo random number may be fed into one input of a comparator 325 and a density register 330 may be coupled to the other input of the comparator 325. In typical operation, the PRNG 310 will output a series of pseudo random numbers that are compared with the same value from the density register 330. The comparator 325 outputs a pulse train 335 that may be a first value if the register value is greater than or equal to the latest pseudo random number and a second value if the register value is less than the latest pseudo random number. Thus, it may be stated that the comparator 325 outputs a stochastic pulse train 335 that may be the value in the density register 325 modulated by the pseudo random numbers. Throughout this application, this may also be referred to as a stochastically modulated pulse train 335.

The PRNG 310 of the circuit of FIG. 3 may have a number of states and may be periodic. For example, it may be a 15 state PRNG 310. If the density register 330 is set to seven, the stochastic pulse train 335 may be high whenever the pseudo random number is less or equal to seven. The stochastic pulse train 335 may be low when the pseudo random number is greater than seven. In this fashion, the stochastic pulse train 335 with be high on average seven of out 15 clock cycles, giving the pulse an average signal of 0.467. A conventional pulse train 210 generated by a PWM may also be high seven of out 15 clock cycles or counts for an average of 0.467. However, the stochastic pulse train 335 has a random nature to its pattern. In contrast; a conventional PWM pulse train 210 is high for eight consecutive counts and low for seven consecutive counts. As seen in FIG. 1A and FIG. 1B, this leads to a pulse that has significant energy at low harmonics, which makes it difficult to filter.

In the embodiment of FIG. 3, a seed register 320 (e.g., a polynomial register) may be coupled to a data input of the PRNG 310. The value in the seed register 320 may be used as a seed value to start the generation of the pseudo random numbers. It will be understood that any method of generating pseudo random numbers may be used in embodiments of the present invention. Furthermore, embodiments of the present invention are not limited to using a PRNG 310, actual random numbers may be used as well.

The PRNG 310 in FIG. 3 has a clock input. Some embodiments periodically update the value in the density register 330. The PRNG 310 may be clocked at a higher frequency than the density register 330 is updated, such that the PRNG 310 counts multiple states before the density register 330 is updated. For example, the PRNG 310 may be clocked at 12 MHz, in one embodiment. If the PRNG 310 is an 8-bit PRNG 310 it may have 255 states and may repeat at a rate of 12 MHz/255=47 kHz. Thus, if density register 330 is updated at a rate of less than or equal to 47 kHz, then the PRNG 310 will go through all of its states. However, embodiments of the present invention are not limited to clocking the PRNG 310 fast enough to go though all of its states before the density register 330 is updated. For example, the stochastic pulse train 335 will still have a random nature even if the density register 330 is updated before the PRNG 310 goes through all 255 states. Thus, it is not required that the density register update coincides with a complete state cycle of the PRNG 310. In contrast, a conventional PWM DAC updates the digital sample to coincide with the number of counts in the PWM pulse 110. For example, the PWM pulse 110 may have 255 counts and may be low for x consecutive counts and high for 255-x consecutive counts in order to have the PWM pulse 110 have the correct average value. Referring to conventional art FIG. 1A, it is clear how the average magnitude of the pulse 110 would be wrong (e.g., not equal to 0.5) if the pulse 110 were cut off at, for example, count 200.

As a further illustration of clocking the PRNG 310, an embodiment of the present invention clocks the PRNG 310 at about 12 MHz and updates the density register at about 47 kHz. In this case, the PRNG 310 has 255 states, although the PRNG 310 may be designed to have any number of states. Increasing the number of states that the PRNG 310 may increase the randomness of the PRNG 310 output and hence lead to a stochastic pulse train 335 with better characteristics. For example, the harmonic content may be easier to filter.

Figure 4A:
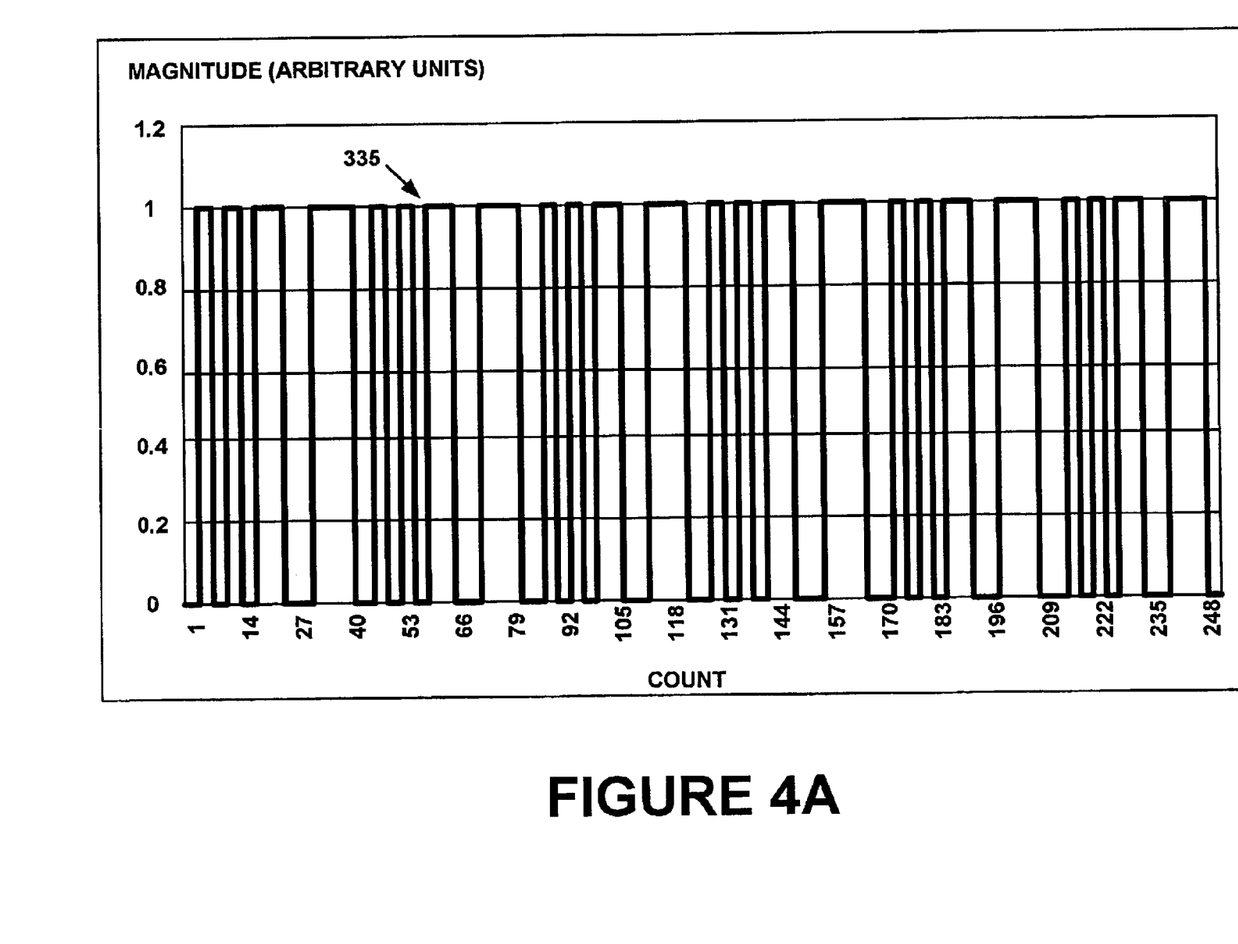
FIG. 4A illustrates a portion of a stochastically modulated pulse having its output high one-half of the time, according to an embodiment of the present invention.

FIG. 4A illustrates an exemplary stochastic pulse train 335 derived from a PRNG 310 that outputs pseudo random numbers between 1 and 256. In this example, the density register 330 value is 128. Thus, the stochastic pulse train 335 may be high half the time on average. Note that the stochastic pulse train 335 is random and goes between a high and a low value many times in the 255 counts shown. In contrast, the conventional PWM pulse 110 in conventional art FIG. 1A only flips from low to high once in the 255 counts shown.

Figure 4B:
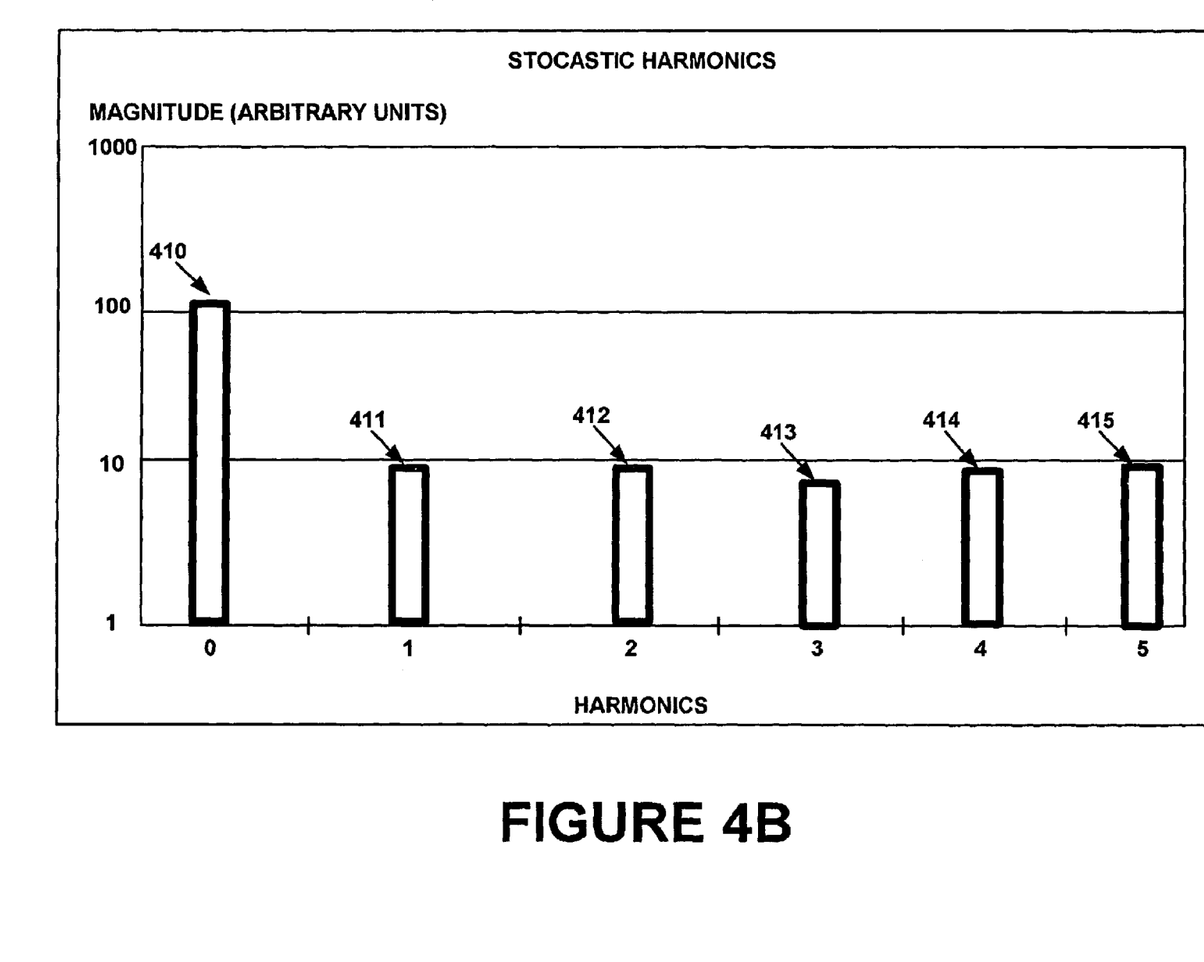
FIG. 4B illustrates harmonic content of the stochastically modulated pulse of FIG. 4A, according to an embodiment of the present invention.

This randomness leads to a stochastic pulse train 335 that has relatively low energy at low harmonics, as seen in FIG. 4B. The harmonic of interest (zeroeth harmonic 410) has a magnitude of 128, as expected. The first through fifth harmonics (411–415) all have magnitudes below 10. This is in contrast to the conventional PWM harmonics seen in conventional art FIG. 1B, in which the first harmonic 141 has a magnitude close to 100 and the third and fifth harmonics 143, 145 have magnitudes above ten.

Figure 5:
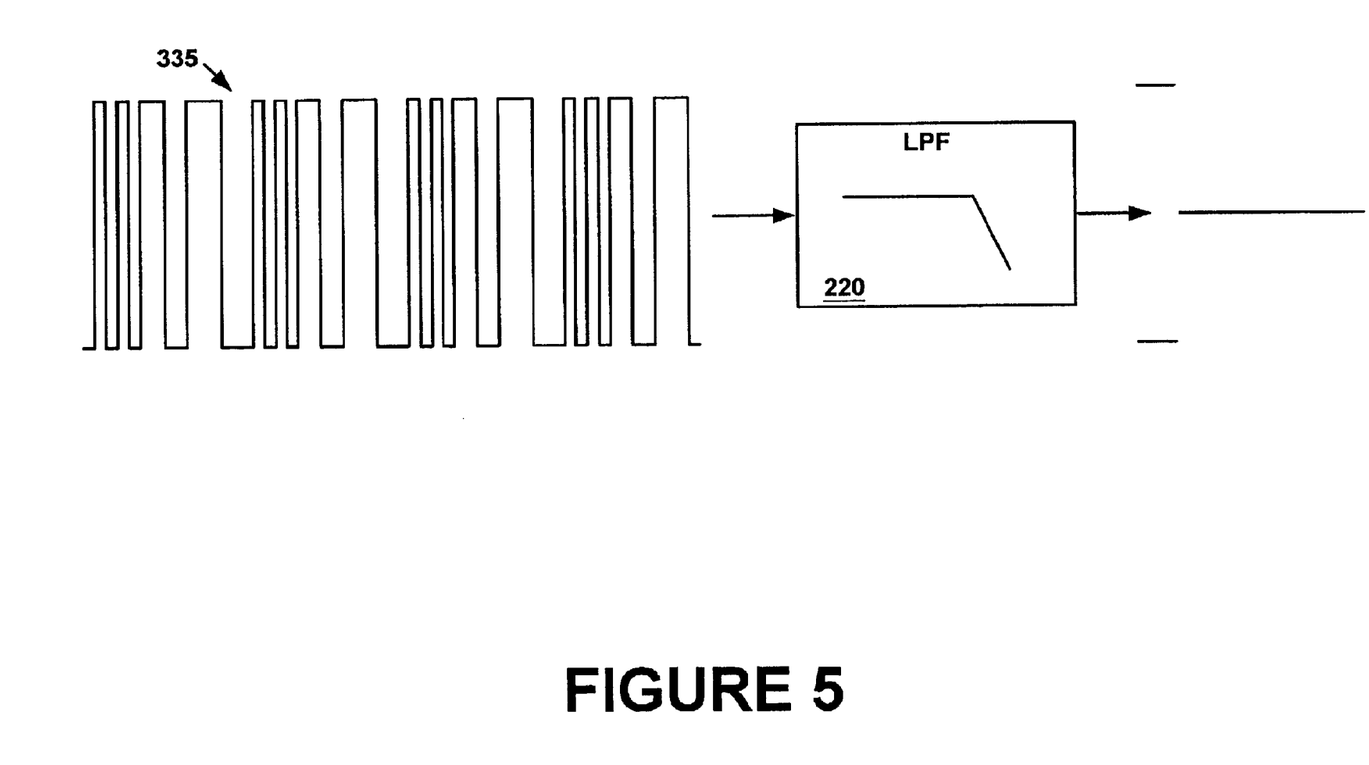
FIG. 5 illustrates results of filtering a stochastically modulated pulse train, according to an embodiment of the present invention.

FIG. 5 illustrates an exemplary stochastic pulse 335 filtered by a low-pass filter 220. Comparing FIG. 5 with conventional art FIG. 2, the same low-pass filter 220 is being used to filter each pulse signal (210, 335). However, embodiments of the present invention remove more noise than the conventional PWM method using the same low-pass filter 220. The reason is evident from a comparison of conventional art FIG. 1B with FIG. 4B. In particular, the magnitude of the first harmonic 411 of the embodiment in FIG. 4B is an order of magnitude below magnitude of the first harmonic 141 in the conventional art.

Figure 6:
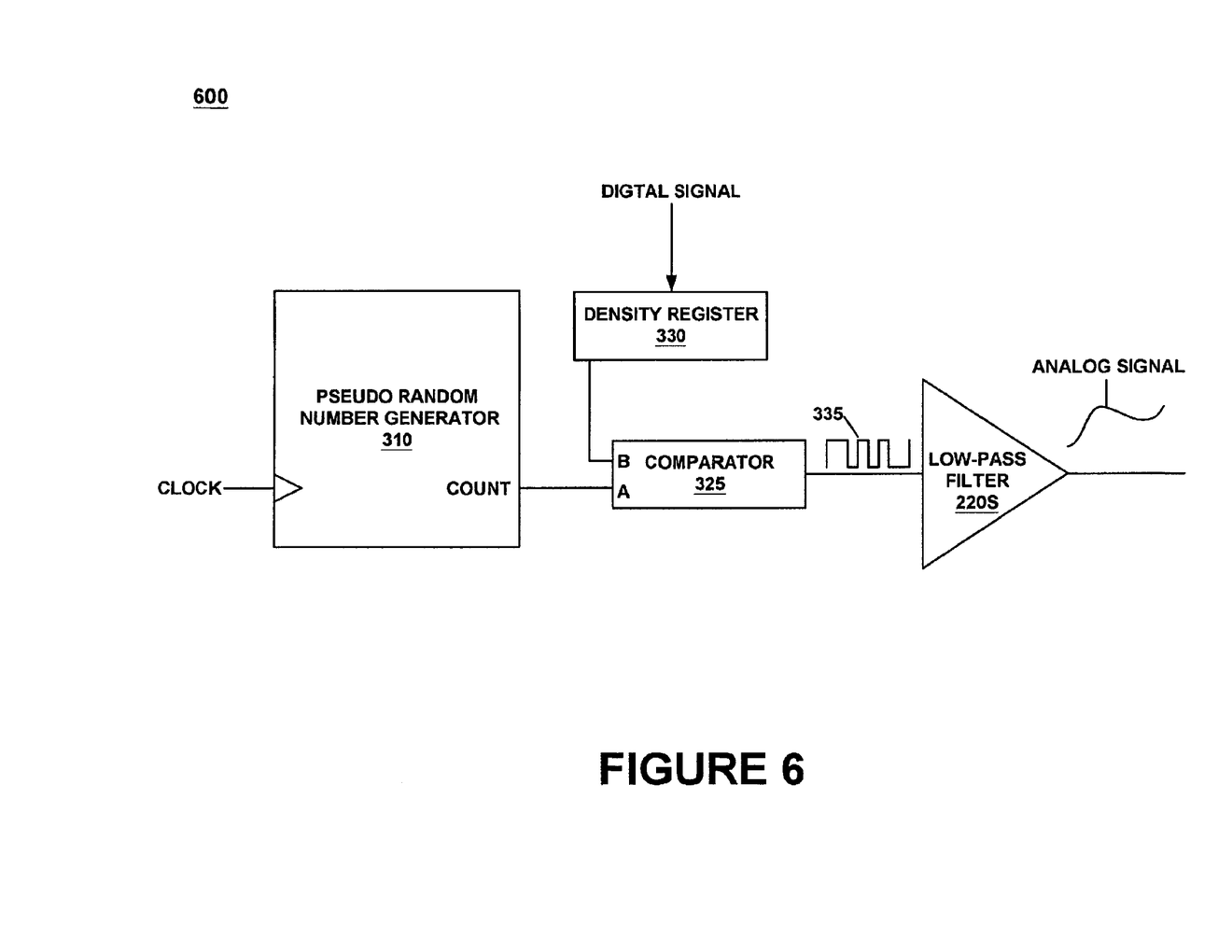
FIG. 6 illustrates a stochastic DAC, according to an embodiment of the present invention.

An embodiment of the present invention is a stochastically modulated DAC 600, as illustrated in FIG. 6. In this embodiment, samples of the digital signal are input to the density register 330. The density register 330 may have any desired number of bits to handle whatever resolution the digital signal has. The PRNG 310 may output pseudo random numbers that have as many or more bits as the density register 330. If there are more bits in the pseudo random numbers, then the comparator 325 may ignore some bits in the pseudo random numbers.

Still referring to FIG. 6, the stochastically modulated DAC 600 also has a low-pass filter 220s at the output of the comparator 325. In this fashion, the stochastic pulse train 335 is turned into an analog signal that may correspond to the digital input signal. However, the low-pass filter 220s in the stochastic DAC may be less expensive than one required in a conventional PWM DAC.

The ability of embodiments of the present invention to filter out the harmonic content more easily than a conventional PWM DAC leads to a variety of benefits. Embodiments of the present invention may remove more noise than does a conventional PWM DAC using the same low-pass filter 220. Embodiments of the present invention may use a simpler low-pass filter 220 than used by a conventional PWM DAC, while still removing at least as much noise as a conventional PWM DAC. Embodiments of the present invention may use a low-pass filter 220 with poles at a higher frequency and hence provide a greater bandwidth, while still removing at least as much noise as a conventional PWM DAC with a low-pass filter 200 with poles at a lower frequency. Additionally, various combinations of these advantages are possible.

Removing more harmonic content with the same low-pass filter 200 as the conventional PWM DAC is evident from comparing the conventional art FIG. 1B with FIG. 4B. Those Figures show an embodiment of the present invention has an order of magnitude less energy at the first harmonic than the conventional PWM signal. Thus, the same low-pass filter 200 eliminates more harmonic content in embodiments of the present invention than does the conventional PWM DAC.

Additionally, embodiments of the present invention may use a simpler low-pass filter 220 than used by a conventional PWM DAC, while still removing at least as much noise as a conventional PWM DAC. For example, an embodiment of the present invention may use three-pole low-pass filter 220 and still remove more noise than a four-pole filter 220 removes on a conventional PWM pulse train 210. For example, in each case the first harmonic may be at 47 kHz and each low-pass filter 220 may have its poles at 10 kHz. The three-pole low-pass filter 220 would remove about 99% of the first harmonic energy (FIG. 4B, 411) and the four-pole low-pass filter 220 would remove about 99.8% of the first harmonic (FIG. 1B, 141). However, since the first harmonic 141 in the conventional PWM contains about 10 times as much energy as embodiments of the present invention, the present embodiment only leaves half the noise that the conventional PWM DAC leaves. Thus, this embodiment of the present invention filters more noise with a simpler low-pass filter 220 (e.g., one less pole). This saves cost and allows for a system with a faster response.

Alternatively, if the performance of a three-pole low-pass filter 220 of the present embodiment is compared to a five pole low-pass filter 220 with a conventional PWM DAC, the conventional system would only filter slightly more noise, but at the expense of two extra poles. Thus, this three-pole low-pass filter 220 embodiment of the present invention may be considerably cheaper and faster than a conventional PWM DAC with five-poles, with nearly the same performance. For example, the five-pole system will leave about 0.04% of the first harmonic (FIG. 1B, 141) and the three-pole embodiment will leave about 1% of the first harmonic (FIG. 4B, 411). However, assuming the first harmonic 141 in the conventional PWM system is an order of magnitude larger than an embodiment of the present invention, the magnitude of the residual first harmonic noise may be about the same.

A still further benefit of embodiments of the present invention is that a low-pass filter 220 with pole(s) at a higher frequency and hence of greater bandwidth may be used, while still removing at least as much noise as a conventional PWM DAC with a low-pass filter 220 with poles at a lower frequency. For example, if four poles are placed at 20 kHz, then about 3.3% of the first harmonic (FIG. 4B, 411) at 47 kHz will get through. A conventional PWM DAC with four poles at 10 kHz gives about the same overall performance, letting 0.2% of the first harmonic (FIG. 1B, 141) through. However, its first harmonic 141 may be about 10 times the magnitude as the first harmonic 411 of an embodiment of the present invention, so the net noise may be about the same. Thus, this embodiment of the present invention allows for a wider bandwidth low-pass filter 220 and still performs about the same with respect to noise reduction, without resorting to constructing a more complex low-pass filter 220.

An embodiment of the present invention provides for a method of generating a stochastic pulse train 335. The stochastic pulse train 335 has many uses and is not limited to implementing a stochastic DAC 600. For example, the stochastic pulse train 335 may be used to dither a signal of interest. Referring now to process 700 of FIG. 7, in step 710, a value is loaded into the density register 330. In one embodiment, the value is an n-bit sample of a digital signal that comprises a number of samples. The digital signal may be converted to an excess code in this step. For example, if the digital signal has eight bits of resolution, then an excess-128 code may represent the digital signal.

Figure 7:
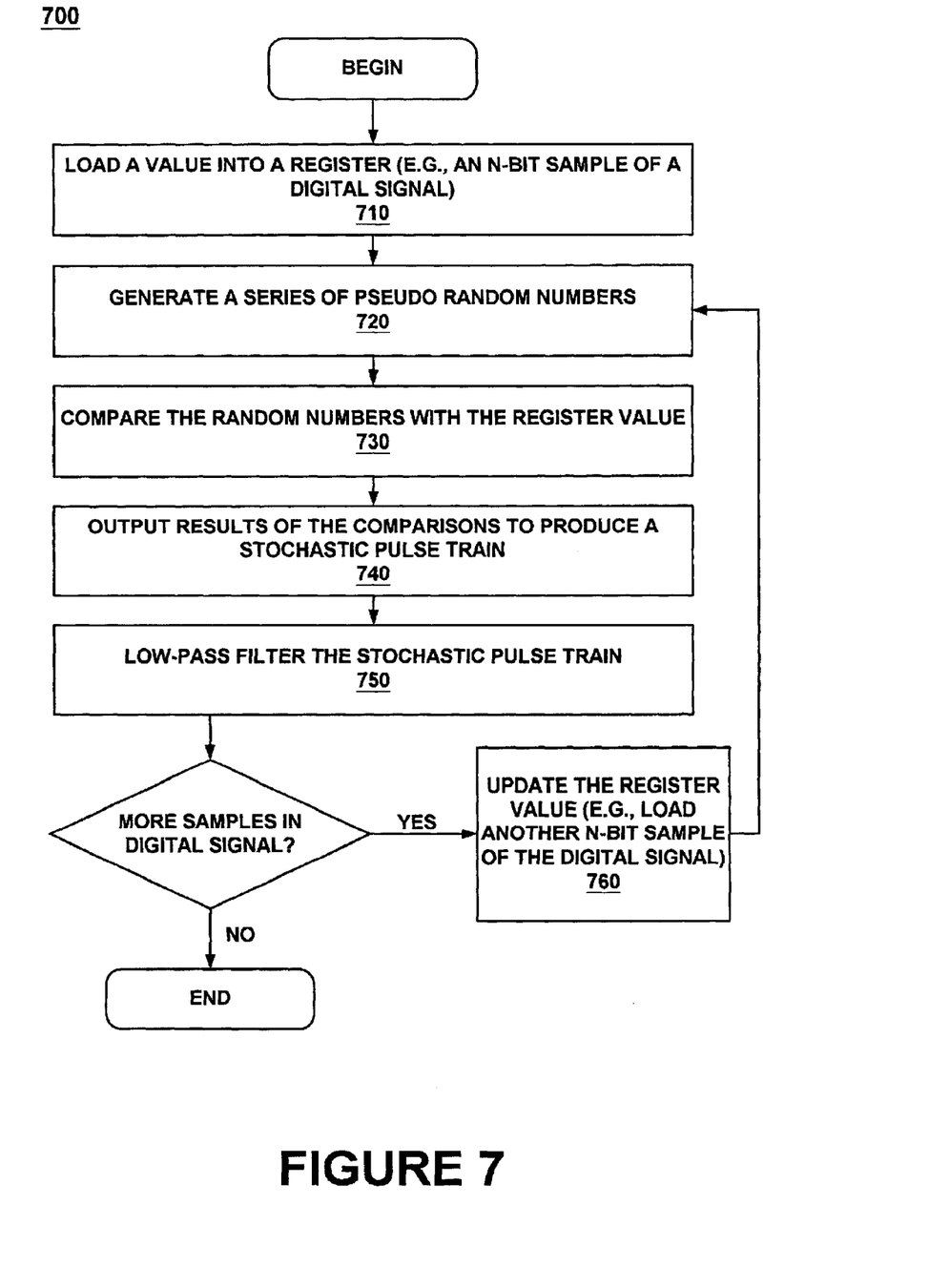
FIG. 7 illustrates steps of a process of producing a stochastically modulated pulse, according to an embodiment of the present invention.

In step 720, the PRNG 310 generates a series of pseudo random numbers. In another embodiment, the numbers are actual random numbers. The series may be periodic and may repeat at a suitable interval to create the desired randomness. For example, if the PRNG 310 has more states (e.g., counts) then the stochastic pulse train 335 will be more random and hence, it may be even easier to filter unwanted harmonic content.

In step 730, the series of pseudo random numbers generated in step 720 are fed into the comparator 325 one-by-one and compared to the value in the density register 330. The pseudo random numbers may have been generated at a substantially higher rate than samples of the digital signal are fed into the density register 330 so as to allow for a suitable random effect to occur in the stochastic pulse train 335.

In step 740, the comparator 325 outputs the results of the comparison in step 730 as a stochastic pulse train 335. The duty cycle of this stochastic pulse train 335 will be related to the value in the density register 330. For example, the duty cycle may be ½ if the value in the density register 330 is an 8-bit register whose value is '128', using an excess-128 code.

In step 750, the stochastic pulse train 335 is filtered with a low-pass filter 220. However, this step is not required, as embodiments of the present invention use an unfiltered stochastic pulse train 335. For example, the unfiltered stochastic pulse train 335 may be used for dithering.

If it is desirable to change the value in the density register 330, then the value is updated in step 760. For example, If a stochastic DAC 600 is being implemented, then another sample of the digital signal is loaded into the density register 330. However, the value in the density register 330 may be updated for other reasons. Steps 720–760 are repeated as desired. Then process 700 ends.

In one embodiment of the present invention, the stochastic pulse train 335 may be used to add noise with a known duty cycle that may be changed to suit the desired application by changing the value in the density register 330. For example, an embodiment provides for dithering. In one embodiment, the stochastic pulse train 335 is applied to the input of an analog-to-digital converter (A/D converter) to obtain extra resolution out of the A/D converter. For example, an A/D converter with a resolution of 1 volt may read 9 volts for a signal whose true value is closer to 9.3 volts. As described herein, the value in the density register 330 may define the average value of the stochastic pulse train 335. This average value may be varied between –0.5 volts to 0.5 volts with the effect on the A/D converter output being observed. Because the stochastic pulse train 335 is not a single frequency signal, adding it to the input of the A/D converter may not harm the signal. In contrast, if a simple 60 Hz sine wave were added to the input of the A/D converter, this signal could have a very severe impact due to the harmonic content of the sine function. Thus, embodiments of the present invention provide for a way to dither a signal while minimizing the chance of adding damaging harmonic content.

Embodiments of the present invention generate a stochastic pulse train 335 that has probability of being a first value (e.g., 1) a given percentage of the time and a second value (e.g., 0) another given percentage of the time. Those of ordinary skill in the art will recognize many uses for such a stochastic pulse train 335 whether it is filtered or not.

The preferred embodiment of the present invention, a device and method for generating a stochastically modulated pulse train, is thus described. While the present invention has been described in particular embodiments, it should be appreciated that the present invention should not be construed as limited by such embodiments, but rather construed according to the below claims.

What is claimed is:

1. A pulse generator, comprising:
   a random number generator comprising an output;
   a comparator comprising a first input coupled to said output of said random number generator and a second input;
   a register coupled to said second input of said comparator;
   a low-pass filter coupled to an output of said comparator; and
   wherein said comparator performs comparisons of values generated by said random number generator and a value in said register, wherein said comparator outputs a pulse that is modulated according to said comparisons.

2. The pulse generator of claim 1, wherein said random number generator is a pseudo random number generator.

3. The pulse generator of claim 2, wherein said register is programmable to allow a duty cycle of said pulse to be modified, wherein said duty cycle is proportional to said register value.

4. A pulse generator, comprising:
   a random number generator comprising an output;
   a comparator comprising a first input coupled to said output of said random number generator and a second input;
   a register coupled to said second input of said comparator;
   wherein said comparator performs comparisons of values generated by said random number generator and a value in said register, wherein said comparator outputs a pulse that is modulated according to said comparisons, and wherein said register is programmable to allow a duty cycle of said pulse to be modified, wherein said duty cycle is proportional to said register value.

5. The pulse generator of claim 4, wherein said register receives a digital signal, and wherein samples of said digital signal are input to said register.

6. The pulse generator of claim 5, further comprising:
   a low-pass filter coupled to an output of said comparator, wherein said low-pass filter outputs an analog signal substantially proportional to said digital signal.

7. The pulse generator of claim 4, wherein said pulse is supplied to a system to inject noise with a programmable duty cycle into said system.

8. The pulse generator of claim 4, wherein said random number generator is a pseido random number generator.

9. A method of generating a pulse, comprising the steps of:
   a) loading a register value into a register;
   b) generating a series of pseudo random numbers;
   c) comparing said pseudo random numbers with said register value; and d) producing a pulse train based on results of said comparisons, wherein said register value is modulated by said pseudo random numbers;

e) updating said register value; and f) repeating said step a) though said step e).

10. The method of claim 9, said step e) comprises feeding an n-bit digital signal into said register, wherein said register is an n-bit register.

11. The method of claim 10, further comprising the step of:

g) low-pass filtering said pulse train.

12. The method of claim 11, wherein:

said step d) comprises outputting a high value if said register value is greater than or equal to a pseudo random number in said series of pseudo random numbers and outputting a low value otherwise.

13. The method of claim 11, wherein:

said step e) comprises updating said register value at a rate at which said digital signal was sampled; and said step b) comprises generating said series of pseudo random numbers at a substantially higher rate than said register is updated.

14. The method of claim 9, further comprising the step of:

g) dithering a signal with said pulse train.

15. A method of generating a pulse, comprising the steps of:

a) loading a register value into a resister;

b) generating a series of pseudo random numbers;

c) comparing said pseudo random numbers with said register value; and d) producing a pulse train based on results of said comparisons, wherein said register value is modulated by said pseudo random numbers;

e) low-pass filtering said pulse train; and f) injecting random noise into a system by outputting said filtering pulse train into said system.

16. A digital-to-analog converter, comprising:

a pseudo random number generator comprising an output;

a comparator comprising a first input coupled to said output of said random number generator, a second input for receiving a digital signal comprising a plurality of samples, and an output;

wherein said comparator performs comparisons of values generated by said pseudo random number generator and samples of said plurality of samples, wherein said comparator outputs a pulse that is modulated according to said comparisons; and a low-pass filter comprising an output and an input coupled to said output of said comparator, wherein said output of said low-pass filter is an analog signal proportional to said digital signal.

17. The digital-to-analog converter of claim 16, further comprising a register coupled to said second input of said comparator and for inputting said digital signal.

18. The digital-to-analog converter of claim 16, wherein said random number generator further comprises a clock input; and wherein said pseudo random number generator is clocked at a rate sufficient to output multiple random numbers for each of said samples of said digital signal.

19. The digital-to-analog converter of claim 16, further comprising a polynomial register coupled to said random number generator and for storing a seed value for said random number generator.

* * * * *